(12) United States Patent
Daudin

(10) Patent No.: US 9,093,608 B2
(45) Date of Patent: Jul. 28, 2015

(54) METHOD OF MANUFACTURING A LIGHT EMITTING DIODE COMPRISING A LAYER OF ALGAN HETEROGENEOUS

(71) Applicant: Commissariat a L'energie Atomique et aux Energies Alternatives, Paris (FR)

(72) Inventor: Bruno Daudin, La Tronche (FR)

(73) Assignee: Commissariat a L'energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 14/140,820

(22) Filed: Dec. 26, 2013

(65) Prior Publication Data

US 2014/0175476 A1 Jun. 26, 2014

(30) Foreign Application Priority Data

Dec. 26, 2012 (FR) ..................................... 12 62794

(51) Int. Cl.
*H01L 33/00* (2010.01)
*H01L 33/32* (2010.01)
*H01L 33/06* (2010.01)

(52) U.S. Cl.
CPC ............ *H01L 33/32* (2013.01); *H01L 33/0075* (2013.01); *H01L 33/0095* (2013.01); *H01L 33/06* (2013.01)

(58) Field of Classification Search
None
See application file for complete search history.

(56) References Cited

U.S. PATENT DOCUMENTS

| 7,498,182 B1 * | 3/2009 | Sampath et al. ................. 438/21 |
| 7,994,524 B1 * | 8/2011 | Chung et al. .................... 257/90 |
| 2003/0094618 A1 | 5/2003 | Sakai |

OTHER PUBLICATIONS

Search Report issued by French Patent Office for priority application, FR1262794 and dated Oct. 10, 2013.

* cited by examiner

*Primary Examiner* — Kyoung Lee
(74) *Attorney, Agent, or Firm* — Frommer Lawrence & Haug LLP; Ronald R Santucci

(57) ABSTRACT

The process for the manufacture of a light-emitting diode comprises the following stages: the formation of a stack (1) of layers intended to emit light comprising first (2), second (3) and third (4) layers of aluminum gallium nitride, the said second layer (3), positioned between the first and third layers (2, 4), having an aluminum gallium nitride composition different from that of the first and third layers (2, 4); and the implementation of a demixing of the second layer (3) of aluminum gallium nitride carried out after formation of the said second layer.

7 Claims, 1 Drawing Sheet

US 9,093,608 B2

METHOD OF MANUFACTURING A LIGHT EMITTING DIODE COMPRISING A LAYER OF ALGAN HETEROGENEOUS

This application claims priority benefits to French Patent Application 12/62794 filed Dec. 26, 2012, the disclosure of which is incorporated herein by reference.

TECHNICAL FIELD OF THE INVENTION

The invention relates to the field of microelectronics and more particularly to light-emitting diodes.

The subject-matter of the invention is more particularly a process for the manufacture of a diode.

STATE OF THE ART

It is known to manufacture light-emitting diodes based on a stack of layers comprising aluminium gallium nitride.

It is currently accepted that light-emitting diodes based on aluminium gallium nitride exhibit a very poor efficiency, of the order of 5%, this poor efficiency being in comparison with the 80% efficiency of the best light-emitting diodes in the visible spectrum.

SUBJECT-MATTER OF THE INVENTION

The aim of the present invention is to provide a solution which makes it possible to improve the output of light-emitting diodes based on aluminium gallium nitride.

This aim is targeted in that the process for the manufacture of a light emitting diode comprises the following stages: the formation of a stack of layers intended to emit light comprising first, second and third layers of aluminium gallium nitride, the said second layer, positioned between the first and third layers, having a different aluminium gallium nitride composition from that of the first and third layers; and the implementation of a demixing of the second layer of aluminium gallium nitride carried out after formation of the said second layer.

Advantageously, the first and third layers are deposited during the formation of the stack so as to form layers of aluminium gallium nitride having the composition $Al_yGa_{1-y}N$ and the second layer is deposited during the formation of the stack so as to form a layer of aluminium gallium nitride having the composition $Al_xGa_{1-x}N$, with x different from y and preferably y strictly greater than x.

Preferably, x is between 0.1 and 0.8, limits included, and $0.01 \leq y-x \leq 0.1$ and advantageously $y=x+0.05$.

According to one embodiment, the stage of implementation of the demixing is configured so as to form a heterostructure comprising a matrix having the composition $Al_{x1}Ga_{1-x1}N$ which coats islets having the composition $Al_{x2}Ga_{1-x2}N$ with x1 different from x2.

Preferably, x2 is strictly less than y and preferably equal to $y-0.05$.

According to a first example, the demixing stage is carried out after deposition of the second layer on the first layer but before deposition of the third layer on the second layer.

According to a second example, the demixing stage is carried out after the stage of formation of the stack, in particular by using a laser adjusted so that its light is absorbed by the second layer but not by the first and third layers.

The invention also relates to a light-emitting diode obtained by the process as described or more generally to a light-emitting diode comprising comprise an emissive stack comprising first, second and third layers of aluminium gallium nitride, the said second layer being a heterostructure, positioned between the first and third layers, comprising a matrix according to a first aluminium gallium nitride composition which coats islets according to a second aluminium gallium nitride composition different from the first composition.

In the diodes, the first and third layers advantageously have the composition $Al_yGa_{1-y}N$, y preferably being between 0.15 and 0.85, limits included, and the matrix has the composition $Al_{x1}Ga_{1-x1}N$ and the islets have the composition $Al_{x2}Ga_{1-x2}N$ with x1 different from x2, x2 preferably being less than y.

The invention also relates to a light hand comprising at least one light-emitting diode as described.

BRIEF DESCRIPTION OF THE DRAWINGS

Other advantages and characteristics will emerge more clearly from the description which will follow of specific embodiments of the invention given as nonlimiting examples and represented in the appended drawings, in which.

DESCRIPTION OF PREFERRED FORMS OF THE INVENTION

The process and the diode which are described afterwards differ from the prior art in particular in that a specific treatment is applied to at least one layer of aluminium gallium nitride so as to reduce the nonradiative recombination of carriers on structural defects, such as threading dislocations, and to increase the radiative recombination in nanometric regions where these same carriers are trapped.

In fact, during the formation of a stack of layers based on aluminium gallium nitride, it turns out that some regions can exhibit defects. These defects are assumed to be a major source of nonradiative recombinations. This thus results in a possibility of promoting strong radiative recombination by protecting the carriers from their defective environment by the presence of appropriate regions in a diode structure.

Nevertheless, it turns out that aluminium gallium nitride is a system sufficiently homogeneous throughout the composition range not to allow the spontaneous localization of the carriers in regions devoid of structural defects. It is thus not a priori possible to take advantage, for example, of the presence of regions having a higher Ga composition in one and the same AlGaN layer, which might make it possible to limit the prejudicial effects to a large amount of structural defects.

In order to respond to this problem, a specific process for the manufacture of at least one light-emitting diode has been produced.

Figure 1:
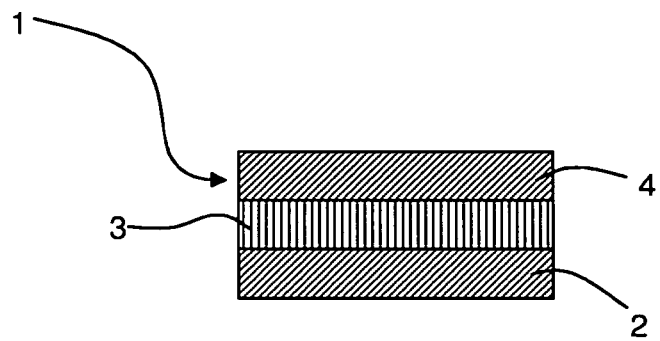
FIG. 1 is a cross-sectional view of a stack before demixing.
Figure 2:
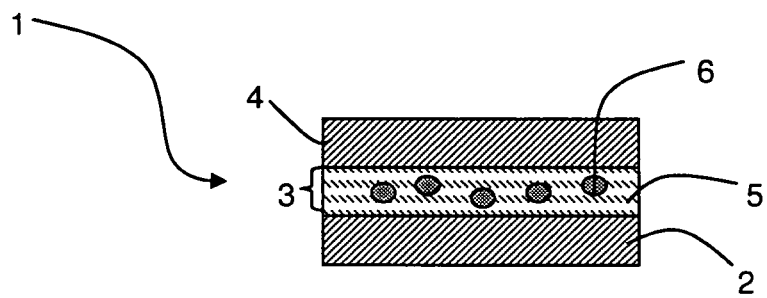
FIG. 2 is a cross-sectional view of a stack after demixing.

As illustrated in FIGS. 1 and 2, a process for the manufacture of a light emitting diode comprises a stage of formation of a stack 1 of layers (FIG. 1) intended to emit light. Typically, at least one layer of the stack 1 is a source of recombinations which make it possible to generate the light so as to emit it. This stack 1 comprises first 2, second 3 and third 4 layers of aluminium gallium nitride. The second layer 3 is positioned between the first and third layers 2, 4. Furthermore, this second layer 3 has a different aluminium gallium nitride composition from that of the first 2 and third 4 layers. The stack 1 can successively comprise the first 2, second 3 and third 4 layers of aluminium gallium nitride, in other words, these layers are in direct contact in pairs but other layers can alternately be inserted in order to improve the overall efficiency of the diode.

Advantageously, in the context of the diode, the first and third layers 2 and 4 are doped respectively of p type and of n type in order to form potential barriers in order to prevent the carriers from escaping from the second layer 3, which then forms an active layer of the diode, once they have been collected. Preferably, the second layer 3 exhibits a composition which is lower in aluminium than the first and third layers 2, 4. The second layer 3 is also known as potential well.

Figure 3:
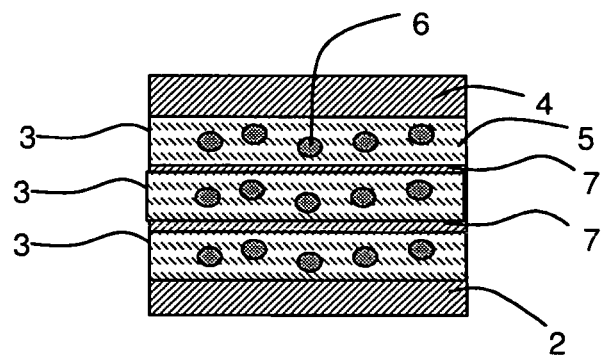
FIG. 3 illustrates a cross-sectional view of a stack comprising several layers which have been subjected to demixing.

According to an alternative form illustrated in FIG. 3, several second layers 3, separated in pairs by a barrier layer 7, are produced between the first and third layers 2, 4. This has the effect of improving the efficiency of the diode. Preferably, the diode comprises between three and five second layers, the two which are furthest apart of which are preferably in direct contact respectively with the first layer 2 and the third layer 4. Each barrier layer 7 is generally of the same composition as the first and third layers 2, 3, except that they are not doped.

Preferably, the first and third layers 2, 4 have an identical aluminium gallium nitride composition (that is to say, exhibiting the same homogeneity).

Finally, the process comprises a stage of implementation of a demixing, in particular of thermal origin, of the second layer 3 of aluminium gallium nitride. The term "thermal origin" is understood to mean an intentional contribution of heat so as to modify the structure of a layer. This stage has the effect of modifying the homogeneous structure of the second layer 3 to give a heterogeneous structure. This heterogeneous structure then preferably comprises a matrix 5 made of aluminium gallium nitride which coats islets 6 made of aluminium gallium nitride, the islets being different in composition from the matrix 5 (FIGS. 2 and 3). The aim of the islets 6 is to form preferential regions of recombination of the carriers so as to improve the output of the light-emitting diode, thus making it possible to compensate for the non-emitting recombinations in some structural defects. Unexpectedly, it is possible to implement a demixing which makes possible a phase separation of the aluminium gallium nitride alloy which initially constituted the second layer 3 so as to form a matrix 5 which is richer in aluminium than the islets 6 (the matrix comprises more aluminium than the islets) and islets 6 which are richer in gallium than the matrix 5 (the matrix then comprises less gallium than the islets).

In other words, an islet 6 delimits a volume formed, at least in part or completely, by a given composition of aluminium gallium nitride, the volume being completely coated by a material formed of a different aluminium gallium nitride composition and forming the matrix 5.

Preferably, the islets and the different layers of the stack are crystalline and exhibit the same crystallographic orientation, in other words, the matrix 5 and the islets 6 can be crystalline and exhibit the same crystallographic orientation.

The stage of implementing the demixing is advantageously carried out after formation of the said second layer 3, in particular after the deposition of the second layer 3. The term "after formation of the said second layer 3" can then be understood as meaning directly and following the formation of the said second layer, or also after formation of the stack, and the like. In other words, the demixing stage is carried out by modifying the second layer 3 formed.

Preferably, the first and third layers 2, 4 are deposited during the formation of the stack 1 so as to form layers of aluminium gallium nitride having the composition $Al_yGa_{1-y}N$ and the second layer 3 is deposited during the formation of the stack 1 so as to form a layer of aluminium gallium nitride having the composition $Al_xGa_{1-x}N$, with x different from y and preferably x strictly less than y. In fact, the height of the barrier (layers 2 and 4) varies with the concentration of aluminium in the composition of the layer concerned. This is in particular why y>x. Thus, the carriers cannot escape, in particular at ambient temperature, where the thermal excitation gives them an energy which might be enough for them to escape.

Advantageously, x is between 0.1 and 0.8, limits included, and $0.01 \leq y-x \leq 0.1$ and advantageously y=x+0.05. These constraints make it possible to maximize the gain in output of the future light-emitting diode.

It is understood from that which has been said above that the stage of implementation of the demixing can be configured so as to form a heterostructure comprising a matrix 5 having the composition $Al_{x1}Ga_{1-x1}N$ which coats islets 6 having the composition $Al_{x2}Ga_{1-x2}N$, with x1 different from x2 and in particular x2 is strictly less than x1. In fact, the term "heterostructure of a layer" is understood to mean that the layer comprises regions having different compositions, that is to say regions having the same materials but in different ratios/amounts.

Preferably, x, y, x1 and x2 are positive integers strictly greater than 0.

Preferably, x2 is strictly less than y and advantageously $0.01 \leq y-x2 \leq 0.1$, preferably equal to y−0.05, this making it possible, as mentioned above, to maximize the outputs of the future light-emitting diode while keeping the composition of the barriers as low as possible in order to facilitate the implementation of the electrical dopings of n type and of p type.

According to one embodiment, the demixing stage is carried out concomitantly with the deposition of the second layer 3 during the stage of formation of the stack 1, or after deposition of the second layer 3 on the first layer 2 but before deposition of the third layer 4 on the second layer 3. For this, the demixing stage can be an annealing of the second layer 3 after or during its formation. The annealing can be carried out by a temperature greater than 1000° C. Advantageously, the annealing is carried out under the stream of nitrogen and at atmospheric pressure. Such an annealing makes it possible to induce a phase separation in the $Al_xGa_{1-x}N$ (second layer 3) resulting from the decomposition of the $Al_xGa_{1-x}N$ into a novel heterostructure consisting of $Al_{x1}Ga_{1-x1}N$ which coats islets 6 of $Al_{x2}Ga_{1-x2}N$. The annealing is advantageously carried out by taking advantage of the fact that the $Al_yGa_{1-y}N$ is thermally more stable than the $Al_xGa_{1-x}N$; in other words, the annealing is not detrimental to the composition of the first layer 2. According to a test carried out in the laboratory, an annealing at 1700° C. made it possible to convert the second layer 3 into an assembly consisting of crystallites rich in Ga within a matrix rich in Al. These results demonstrate an unexpected demixing of the AlGaN alloy at 50% of average composition into a Ga-rich phase and into an Al-rich phase. Furthermore, the islets 6 each delimit a region which is sufficiently small to allow the carriers to be confined therein without interaction with the extensive crystal defects (dislocations). Thus, such a process makes it possible to increase the efficiency of the radiative recombination by preventing the carriers from undergoing a nonradiative recombination on the dislocations in question.

According to another embodiment, the demixing stage is carried out after the stage of formation of the stack 1, in particular by using a laser adjusted so that its light is absorbed by the second layer 3 but not by the first 2 and third 4 layers.

For example; when the first and third layers 2 and 4 exhibit 30% of aluminium and when the second layer 3 exhibits 40% of aluminium, it is possible to carry out the demixing of the second layer 3 by using a laser (for example, a laser tunable in power), the waveband of which will be adjusted to a value greater than the minimum wavelength absorbed by the second layer 3 (in this instance, 280 nm) but lower than the wavelengths absorbed by the first and third layers (in this instance, 305 nm); in this way, the wavelength of the laser will be absorbed solely by the second layer, which will warm up.

Advantageously, the first layer 2 exhibits a thickness of the order of a micron whereas the third layer 4 is instead of the order of a few hundred nanometers as the p doping is more difficult to carry out (in order to retain a low electrical resistance, it is preferable to have low thicknesses). Finally, the second layer 3 exhibits a thickness of the order of a few tens of nanometers in order to accommodate islets of a few nanometers.

It should be noted that x1 and x2 can take different values depending on the annealing temperature and the annealing time (while this is a simple rise in temperature of the second layer 3 in a controlled chamber or by the use of the laser). Furthermore, in combination with everything which has been said above, x1 can in particular become greater than y. On the other hand, the adjustment of the annealing process, that is to say the demixing stage, is advantageously such that x2 remains strictly less than y and preferentially $y-0.1 \leq x2 \leq y-0.01$, preferably equal to $y-0.05$.

In the heterostructure, it is the islets which are described as "active". It is them which have to adhere to the relationship between x and y. The matrix then does not participate in the operation.

The process can be widened to the manufacture of a plurality of light-emitting diodes starting from one and the same support substrate, it being possible for the stacks of different diodes to then be prepared simultaneously.

Of course, the invention also relates to a light-emitting diode obtained by the process as described. Such a light-emitting diode will not be described in detail as, apart from the specific composition of the second layer 3 in particular obtained by the process as described, the other constituent components of the light-emitting diode are common to a person skilled in the art.

Figure 4:
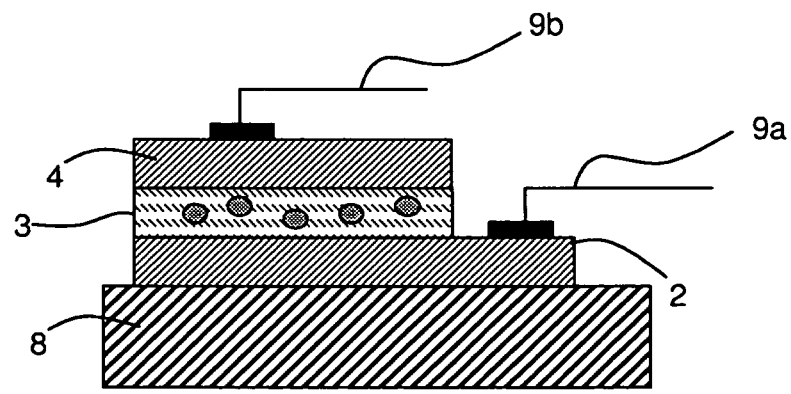
FIG. 4 illustrates a specific implementation of a diode.

Typically, the diode can be prepared on a support substrate 8 so that the electrical contacts 9a, 9b are taken from the first and third layers 2, 4, as illustrated in FIG. 4.

In other words, to generalize, the light-emitting diode can comprise an emissive stack comprising first, second and third layers 2, 3, 4 of aluminium gallium nitride, so that the second layer 3 is positioned between the first and third layers 2, 4. The second layer 3 then exhibits a heterostructure comprising a matrix 5 according to a first aluminium gallium nitride composition which coats islets 6 according to a second aluminium gallium nitride composition different from the first composition. In particular, the first composition is richer in aluminium than the second composition and the second composition is richer in gallium than the first composition.

Advantageously, in the light-emitting diode, the first and third layers 2, 4 have the composition $Al_yGa_{1-y}N$, y preferably being between 0.15 and 0.85, limits included, the matrix has the composition $Al_{x1}Ga_{1-x1}N$ and the islets have the composition $Al_{x2}Ga_{1-x2}N$, with x1 different from x2, x2 preferably being strictly less than y and x1 preferably being strictly greater than x2.

The invention also relates to a light panel comprising at least one light-emitting diode as described according to the different implementations above.

In fact, in a light-emitting diode, the use of the aluminium gallium nitride is advantageous as it allows the said diode to emit light having ultraviolet radiation.

The invention claimed is:

1. Process for the manufacture of a light-emitting diode, which comprises the following stages:
   the formation of a stack of layers intended to emit light comprising first, second and third layers of aluminium gallium nitride, the said second layer, positioned between the first and third layers, having a different aluminium gallium nitride composition from that of the first and third layers,
   the implementation of a demixing of the second layer of aluminium gallium, nitride carried out after formation of the said second layer.

2. Process according to claim 1, wherein the first and third layers are deposited during the formation of the stack so as to form layers of aluminium gallium nitride having the composition $Al_yGa_yN$ and that the second layer is deposited during the formation of the stack so as to form a layer of aluminium gallium nitride having the composition $Al_xGa_xN$, with x different from y and preferably y strictly, greater than x.

3. Process according to claim 2, wherein x is between 0.1 and 0.8, limits included, and in that $0.01 \leq y-x \leq 0.1$ and advantageously $y=x+0.05$.

4. Process according to claim 1, wherein the stage of implementation of the demixing is configured so as to form a heterostructure comprising a matrix having the composition $Al_{x1}Ga_{1-x1}N$ which coats islets having the composition $Al_{x2}Ga_{1-x2}N$ with x1 different from x2.

5. Process according to claim 4, wherein x2 is strictly less than y and preferably equal to $y-0.05$.

6. Process according to claim 1, wherein the demixing stage is carried out after deposition of the second layer on the first layer but before deposition of the third layer on the second layer.

7. Process according to claim 1, wherein the demixing stage is carried out after the stage of formation of the stack, in particular by using a laser adjusted so that its light is absorbed by the second layer but not by the first and third layers.

* * * * *